(12) United States Patent
Mirow

(10) Patent No.: US 7,724,104 B2
(45) Date of Patent: May 25, 2010

(54) CONSTANT GAIN AMPLIFIER SYSTEM WITH POSITIVE AND NEGATIVE FEEDBACK

(76) Inventor: Fred A. Mirow, 118 Cornell Rd., Bala Cynwyd, PA (US) 19004

( * ) Notice: Subject to any disclaimer, the term of this patent is extended or adjusted under 35 U.S.C. 154(b) by 63 days.

(21) Appl. No.: 12/151,294

(22) Filed: May 6, 2008

(65) Prior Publication Data

US 2008/0290937 A1    Nov. 27, 2008

Related U.S. Application Data

(60) Provisional application No. 60/931,907, filed on May 26, 2007.

(51) Int. Cl.
*H03F 1/34* (2006.01)
*H03L 1/00* (2006.01)

(52) U.S. Cl. .................. 331/186; 331/183; 331/59; 330/104; 330/112

(58) Field of Classification Search .............. 331/104, 331/112, 182, 183, 185, 186, 189
See application file for complete search history.

(56) References Cited

U.S. PATENT DOCUMENTS 6,191,662 B1 * 2/2001 Volk ........................... 331/158
7,265,624 B2 * 9/2007 Daio et al. .................. 330/260

* cited by examiner

*Primary Examiner*—Robert Pascal
*Assistant Examiner*—James E Goodley

(57) ABSTRACT

Constant and accurate signal gain systems based on controlling oscillator loop gain. A constant gain positive feedback network and an amplifier form an oscillator. Only when the oscillator loop gain is at least one does the oscillator produces an AC signal. Negative feedback of the oscillator's AC signal level is used to keep the loop gain close to or at the value of one by controlling the loop gain of the oscillator circuit. By maintaining the loop gain of the oscillator circuit substantially constant the signal gain is also maintained substantially constant.

12 Claims, 7 Drawing Sheets

CONSTANT GAIN AMPLIFIER SYSTEM WITH POSITIVE AND NEGATIVE FEEDBACK

CROSS-REFERENCE TO RELATED APPLICATIONS

The benefits of filing this invention as Provisional application for patent "Constant gain amplifier system with positive and negative feedback", U.S. PTO #60/931,907 filed May 26, 2007 by Fred Mirow are claimed.

BACKGROUND OF THE INVENTION

This invention relates to systems for providing a constant and accurate signal gain with relatively wide bandwidth based on controlled oscillator loop gain and is described. The constant gain positive feedback network combined with an amplifier forms an oscillator. Only when the oscillator loop gain is at least one does the oscillator produces an AC signal. Negative feedback of the oscillator's AC signal level is used to control the loop gain of the oscillator circuit, keeping the loop gain close to or at one. By maintaining the loop gain of the oscillator circuit substantially constant, the signal gain of the amplifier is maintained substantially constant with the gain primarily set by the positive feedback network gain and to a lesser extent the gain of the negative feedback loop.

In general, the prior art systems have used negative feedback between the output and input of the amplifying circuit for obtaining an accurate constant signal gain. A major problem in such systems has been that to maintain amplifier stability the amplifier frequency bandwidth needed to be limited to obtain relatively large gain and phase margins.

The present invention overcomes the bandwidth limitation of the negative feedback amplifying circuit by allowing the system to become unstable and oscillate. Thus the present invention does not have the same limited frequency bandwidth requirements to maintain large gain and phase margins.

An objective of the present invention is to provide a constant and accurate signal gain system that has a high temperature, radiation, and voltage stability due to its reliance on passive component ratios to set circuit gain values. Passive components such as resistors and capacitors are more stable under these conditions. This invention increases system accuracy by making the accuracy dependent on passive component ratios instead of transistor stability.

Another object of the invention is to provide bandwidth improvement in constant gain signal amplifiers.

A further objective of the invention to provide circuits that are less susceptible to process variances by relying on impedance ratios thereby providing a more consistently manufacturable circuit.

BRIEF SUMMARY OF THE INVENTION

According to this invention, a feedback network section combined with an amplifier section are used along with other elements to form a oscillator. The preferred frequency of oscillation is a frequency that is separated from the input signal frequency range by an amount that makes separation of the two signal relatively easy. In the case when the system only oscillates when the input signal is not being amplified, the frequency of oscillation can also be a frequency that is the same as the input signal frequency.

At the preferred frequency of oscillation, the amplifier has a certain phase shift and the feedback network supplies the remaining phase shift necessary to make the total phase shift at the frequency of oscillation 0 degrees. There are many well known phase shift networks that can be used as part of feedback network such as the twin T, inductor capacitor (LC), and the Wien bridge.

This oscillator will only oscillate when the loop gain of the amplifier and feedback network is at least one when the phase shift is zero degrees. The oscillator state can readily be detected. When oscillating a oscillator AC signal is present and when not oscillating, no AC signal is present at the oscillation frequency. The frequency stability of the oscillation is not critical and it can vary with changes in temperature, voltage, etc. within a relatively wide range that is taken into account during system design, for example 15 percent.

The feedback network uses circuits that depend on the ratio of circuit components, preferably these are passive devices such as capacitors, inductors, and resistors, to provide stable gain over temperature.

The amplifier whose gain is to be maintained at a selected constant value is connected to the feedback network so as form an oscillator. The input signal that is to be amplified is added to the feedback network signal and applied to the amplifier input. The feedback network blocks (significantly reduces the signal amplitude) the amplified input signal, allowing only the oscillation AC signal to pass (not significantly reducing the signal amplitude) through. The amplifier output contains the amplified input signal along with the oscillation AC signal. An other filter blocks the oscillation AC signal, allowing only the amplified input signal to pass through to the systems output.

The amplifier gain is kept constant by using negative feedback of the oscillator AC signal level to control the amplifier gain. As the amplifier gain is varied so is the oscillator's loop gain. The oscillator AC signal level controls a gain varying element of the amplifier. As the oscillator AC signal level varies the loop gain varies. In some cases it may be more convenient to add a separate variable gain network before or after the amplifier to control the signal gain instead of directly varying the amplifier gain. The oscillator AC signal level is of a value that just maintains oscillation by keeping the loop gain at or close to one. Since the gain of oscillator loop, excluding the amplifier, is substantially constant the negative feedback of the oscillator AC signal level to control the amplifier gain maintains the amplifier gain also substantially constant.

In some systems the input signal is applied to a low gain amplifier or even a less than unity gain network such as an optical coupler or laser system. In this situation the positive feedback loop gain may not be enough for oscillation to occur. A fixed gain amplifier is inserted into the positive feedback loop to provide the additional gain needed for oscillation.

This fixed gain amplifier has a limited frequency response requirement due to the fact it only needs to amplify at the frequency of oscillation. Negative feedback can be used on this amplifier. One well know approach is to use a high gain amplifier which uses negative feedback to accurately set the amplifier section's gain. The negative feedback is optimally obtained by using a resistor divider network in which the resistor temperature and voltage characteristics are matched. The effects of temperature on the resistor network are then decreased. This also decreases the effects on the amplifier section since the gain of it is primarily determined by the resistor divider network.

There are many well known methods for implementing amplifier gain varying elements. One method is to use signal controlled variable impedance devices. Some examples for use with voltage control signals are variable resistors obtained by using a FET with it's gate receiving the control signal. Likewise there are many well known methods for obtaining signal controlled variable gain devices. An example of this are transistors. The transistor's gain is varied by varying it's DC operating current level in response to the control signal thus obtaining a signal controlled variable gain device. Also, the inductive coupling (mutual inductance) between inductors may be changed in response to the control signal.

In some systems the amplifier's input offset voltage also needs to be cancelled along with maintaining constant signal gain. This is accomplished by adding well known offset cancellation techniques to the systems for providing a constant and accurate signal gain.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

DETAILED DESCRIPTION OF THE INVENTION

Figure 1:
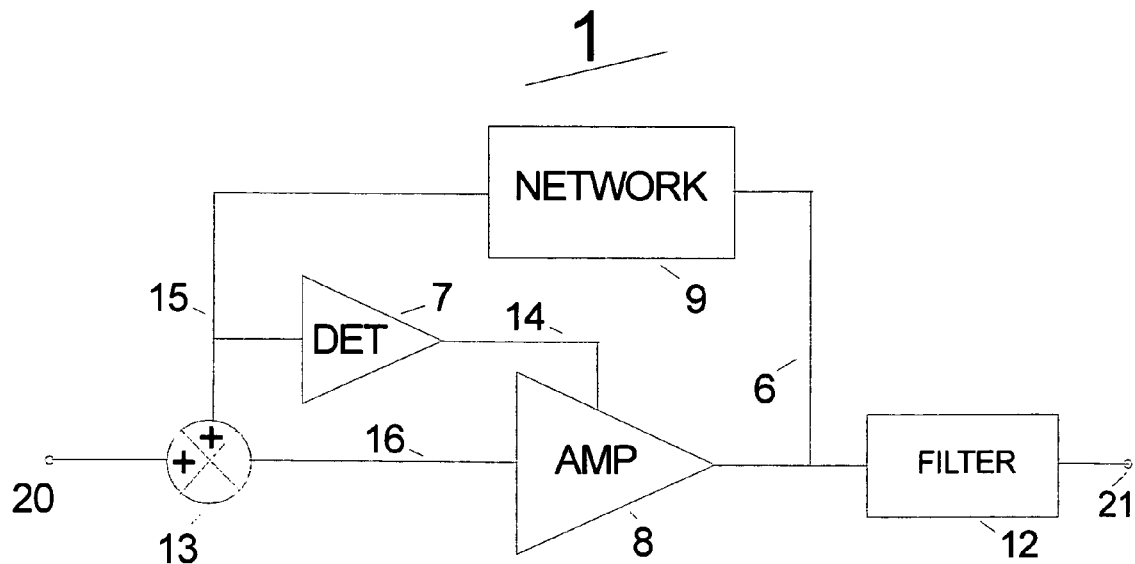
FIG. 1 shows a block diagram of constant gain amplifier system 1.

An embodiment of the invention is shown in FIG. 1. The constant gain amplifier system 1 comprising network 9, detector 7, signal combiner 13, amplifier 8, filter 12, input terminal 20 and output terminal 21. The output of network 9 on line 15 is connected to the input of detector 7 and also to a input to signal combiner 13. The other input of signal combiner 13 is connected to input terminal 20. Signal combiner 13 provides a output signal that is the sum of it's two input signals on line 16 to the input of amplifier 8. Amplifier 8 receives signals to it's gain control input from the output of detector 7 on line 14. The output of amplifier 8 is on line 6 which is connected to the inputs of filter 12 and network 9.

Network 9, signal combiner 13, amplifier 8, form a positive feedback loop which oscillates. The signal path between input terminal 20 and output terminal 21 is through signal combiner 13, amplifier 8, and filter 12.

Amplifier 8 amplifies the signal applied to it's input with a gain controlled by the signal level at it's gain control input. The bandwidth of amplifier 8 is wide enough to provide uniform gain across the entire input signal frequency range and also the frequency of oscillation. Filter 12 blocks (significantly reduces the signal amplitude) the oscillator AC signal from being applied to output terminal 21 while passing (not significantly reducing the signal amplitude) the amplified input 20 signal. Filter 12 and network 9 have a constant or high enough input impedance to not significantly vary the gain of amplifier 8 across the frequency range of interest. Network 9 provides phase shift dependant on frequency and substantially blocks the input signal frequencies. The network 9 phase shift is selected to provide the necessary amount of phase shift along with that of amplifier 8 and signal combiner 13 to ensure oscillation occurs within the selected frequency range. The level of detector 7 gain control output signal is proportional to the oscillation AC signal level at it's input on line 15. Detector 7 also converts the signal at it's input to the type of output signal desired at the amplifier 8 gain control input.

The signal gain of network 9, detector 7, signal combiner 13, and filter 12 are substantially constant. The gain of amplifier 8 varies as the oscillator AC signal level of line 15 varies. As the oscillator AC signal level of line 15 increases, the gain of amplifier 8 decreases causing the oscillator loop gain to be reduced. When the oscillator loop gain is reduced below one, the oscillation stops, and the oscillator AC signal level on line 15 becomes zero. Thus the detector 7 output signal level is of a value that just maintains oscillation. In effect detector 7 provides negative feedback to just maintain a low oscillator AC signal level on line 15 which occurs at a oscillator loop gain at or close to one. Since the only circuit section effecting oscillator loop gain that is not substantially constant is that of amplifier 8, the negative feedback through detector 7 maintains the gain of amplifier 8 substantially constant. The value of amplifier 8 gain is primarily set by the gain of the rest of the positive feedback loop with the gain of the negative feedback loop through detector 7 having a lesser effect. For example by reducing the network 9 gain in half the gain of amplifier 8 is substantially doubled because the product of the gain around the oscillator loop is kept at or close to one.

Figure 2:
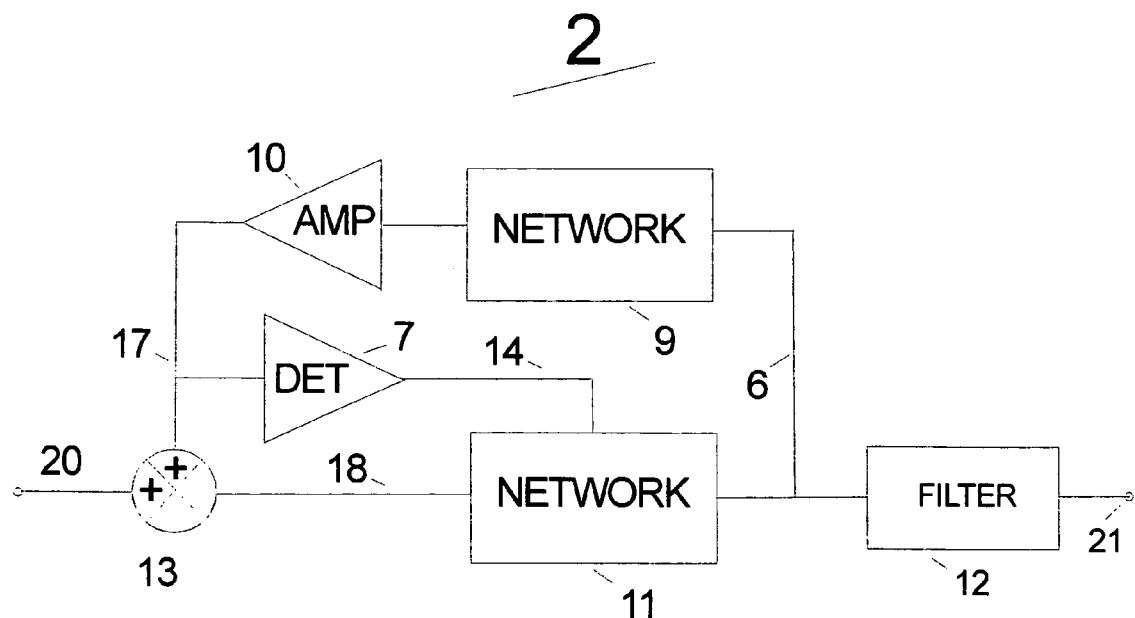
FIG. 2 shows a block diagram of constant gain network system 2.

An other embodiment of the invention is shown in FIG. 2. The constant gain network system 2 comprising network 9, amplifier 10, detector 7, signal combiner 13, network 11, filter 12, input terminal 20 and output terminal 21. The output of amplifier 10 on line 17 is connected to the input of detector 7 and one of the signal combiner 13 inputs. The other input of signal combiner 13 is connected to input terminal 20. Signal combiner 13 provides a output signal that is the sum of it's two input signals on line 18 to the input of network 11. Network 11 receives signals to it's gain control input from the output of detector 7 on line 14. The output network 11 is on line 6 which is connected to the inputs of filter 12 and network 9.

Network 9, amplifier 10, signal combiner 13, and network 11, form a positive feedback loop which oscillates. The signal path between input terminal 20 and output terminal 21 is through signal combiner 13, network 11, and filter 12.

Network 11 gain is controlled by the signal level at it's gain control input. Network 11 may be a passive network with less than unity signal gain or an active network with low signal gain. Constant gain amplifier 10 provides the additional gain needed for oscillation. The bandwidth of network 11 is wide enough to provide uniform gain across the entire input frequency range and also the frequency of oscillation. Filter 12 blocks the oscillator AC signal from being applied to output terminal 21 while passing the input 20 signal frequencies. The network 9 phase shift is selected to provide the necessary amount of phase shift along with that of amplifier 10, signal combiner 13, and network 11 to ensure oscillation occurs in the selected frequency range. Detector 7 converts the oscillator AC signal at it's input on line 17 to the type of output signal desired at the network 11 gain control input.

The signal gain of network 9, detector 7, amplifier 10, signal combiner 13, and filter 12 are substantially constant.

The gain of network 11 varies as the oscillator AC signal level of line 17 varies. As the AC signal level of line 17 increases, the gain of network 11 decreases causing the oscillator loop gain to be reduced. When the oscillator loop gain is reduced below one, the oscillation stops, and the oscillator AC signal level on line 17 becomes zero. Thus the detector 7 output signal level is of a value that just maintains oscillation. In effect detector 7 provides negative feedback to maintain a low AC signal level on line 17 which occurs at a oscillator loop gain at or close to one. Since the only oscillator loop gain section in which the gain is not substantially constant is that of network 11, the negative feedback through detector 7 maintains the gain of network 11 at a substantially constant value. The value of network 11 gain is primarily set by the gain of the rest of the positive feedback loop. For example by reducing the network 9 gain in half the gain of network 11 is substantially doubled because the product of the gain around the oscillator loop is kept at or close to one.

Figure 3:
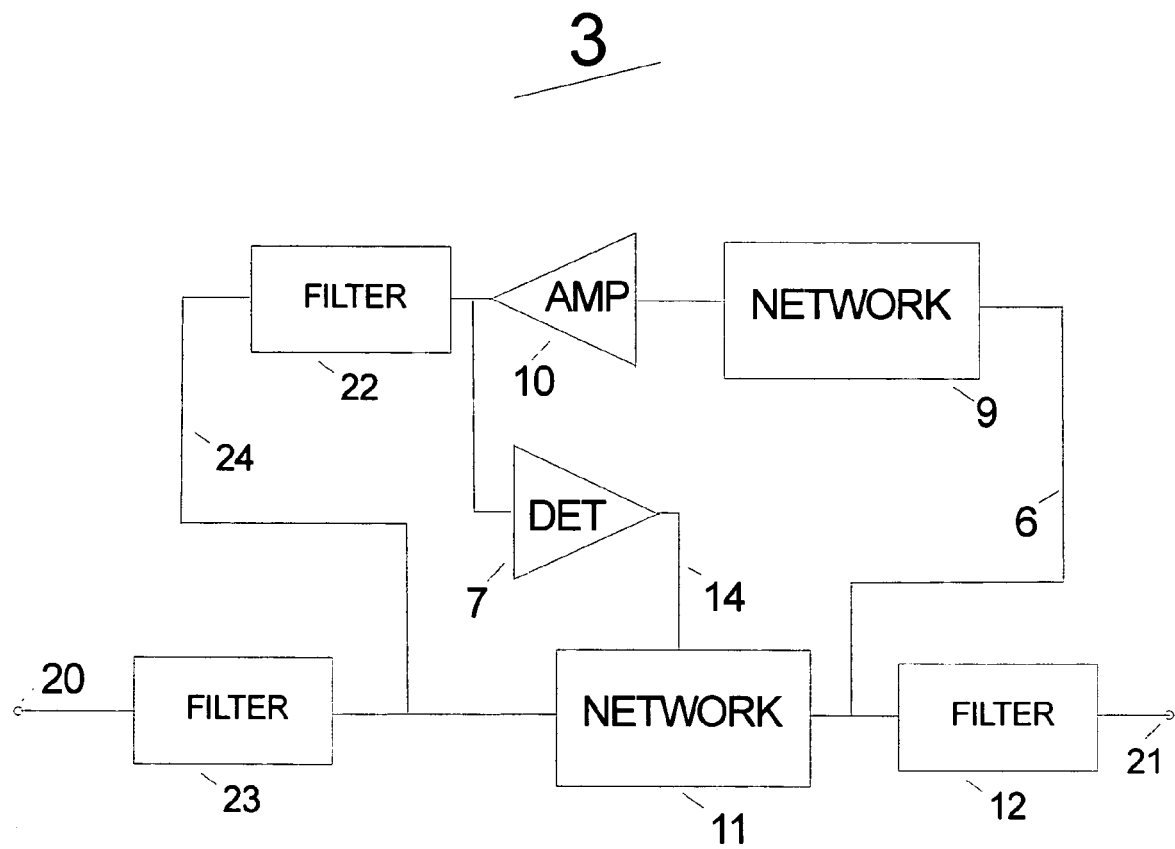
FIG. 3 shows a block diagram of constant gain network system 3.

An other embodiment of the invention is shown in FIG. 3. The constant gain network system 3 comprising network 9, amplifier 10, detector 7, filter 22, filter 23, network 11, filter 12, input terminal 20 and output terminal 21. The output of amplifier 10 on line 17 is connected to the input of detector 7 and filter 22. The input of filter 23 is connected to input terminal 20. The output of filter 22 and filter 23 on line 24 is a signal that is the sum of both filters 22 and 23 input signals. Network 11 receives signals to it's gain control input from the output of detector 7 on line 14. The output of network 11 is on line 6 which is connected to the inputs of filter 12 and network 9.

Network 9, amplifier 10, filter 22, and network 11, form a positive feedback loop which oscillates. The signal path between input terminal 20 and output terminal 21 is through filter 23, network 11, and filter 12. Filter 23 blocks the oscillator AC signal on line 24 signal flow to input terminal 20. Filter 22 passes the oscillator AC signal and blocks the input signal frequencies from the input of detector 7. Filter 12 blocks the oscillator AC signal from being applied to output terminal 21 while passing the input 20 signal frequencies. Filters 12, 22, and 24 have a constant or high enough input impedance to not significantly vary the gain of amplifier 8 across the frequency range of interest.

The network 9 phase shift is selected to provide the necessary amount of phase shift along with that of amplifier 10, filter 22, and network 11 to ensure oscillation occur in the selected frequency range. The output signal level of detector 7 on line 14 is proportional to the oscillation AC signal level at the output of amplifier 10.

The signal gain of network 9, amplifier 10, filter 22, filter 23 and filter 12 are substantially constant. The network 11 gain varies as the oscillator AC signal level at the output of amplifier 10 varies. As the oscillator AC signal level of at the output of amplifier 10 increases, the gain of network 11 decreases causing the oscillator loop gain to be reduced. When the oscillator loop gain is reduced below one, the oscillation stops, and the oscillator AC signal level at the output of amplifier 10 becomes zero. Thus the detector 7 output signal level is of a value that just maintains oscillation. In effect detector 7 provides negative feedback to maintain a low AC signal level at the output of amplifier 10 which occurs at a oscillator loop gain at or close to one. Since the only oscillator loop gain section in which the gain is not substantially constant is that of network 11, the negative feedback through detector 7 maintains the gain of network 11 substantially constant. The network 11 gain is primarily set by the gain of the rest of the positive feedback loop.

Figure 4:
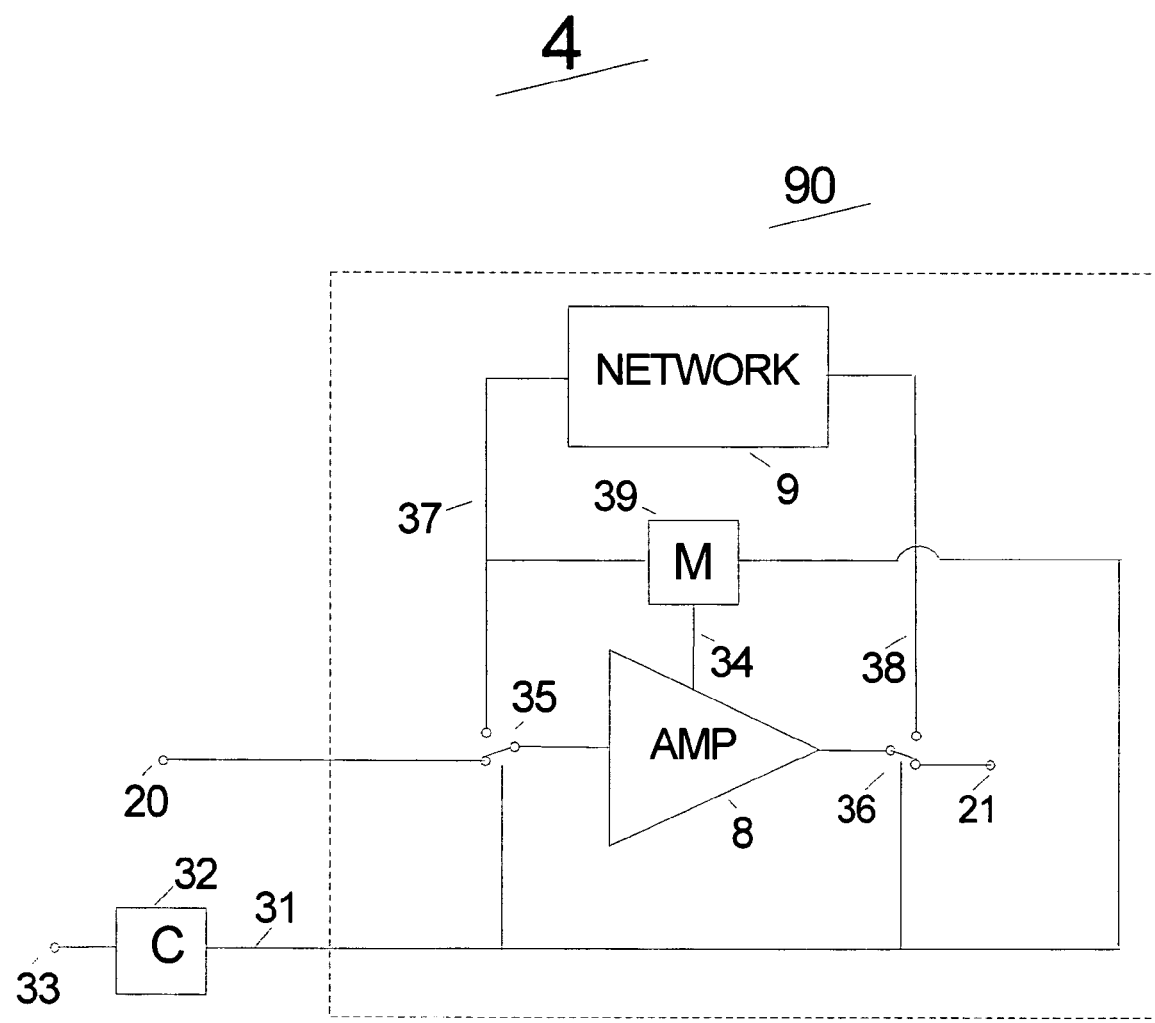
FIG. 4 shows a block diagram of constant gain amplifier system 4.

An other embodiment of the invention is shown in FIG. 4. The constant gain amplifier system 4 comprising amplifier network 90, controller 32, input terminal 20 and output terminal 21. Amplifier network 90 consist of network 9, memory 39, relay 35, relay 36, and amplifier 8.

The input signal level at input terminal 33 controls the controller 32 output signal resulting in either a high or low level on line 31 or alternatively controller 32 may have an internal oscillator causing repeated cycling of output line 31 between high and low level independently of the input signal at input terminal 33. Line 31 is connected to relay 35, relay 36, and memory 39.

When the line 31 signal is high level, constant gain system 4 is in the oscillate mode. Network 9, and amplifier 8, form a positive feedback loop which oscillates when relay 35 connects the amplifier 8 input to line 37 and relay 36 connects the amplifier 8 output to line 38. The output of network 9 on line 37 is also connected to a input of memory 39.

The bandwidth of amplifier 8 is wide enough to provide uniform gain across the entire input frequency range and also the frequency of oscillation. The signal gain of network 9, and memory 39 are substantially constant. Network 9 provides phase shift dependant on frequency. The network 9 phase shift is selected to provide the necessary amount of phase shift along with that of amplifier 8 to ensure that oscillation occur in the selected frequency range. The oscillation frequency may be the same as the input signal frequency since the input signal is not connected at the same time the amplifier network 90 is in oscillate mode.

The output signal level of memory 39 is proportional to the oscillation AC signal level on line 37. Memory 39 converts the signal on line 37 to the type of output signal on line 34 desired at the amplifier 8 gain control input. Amplifier 8 amplifies the signal level applied to it's input by a gain controlled by the signal level on line 34 which is connected to it's gain control input. The gain of amplifier 8 decreases as the oscillator AC signal level of line 37 increases. When the oscillator loop gain is reduced below one, the oscillation stops, and the oscillator AC signal level on line 37 becomes zero. Thus the memory 39 output signal level is of a value that just maintains oscillation. In effect memory 39 provides negative feedback to maintain a low AC signal level on line 37 which occurs at a oscillator loop gain at or close to one. Since the only gain that is not substantially constant is that of amplifier 8, the negative feedback through memory 39 maintains the gain of amplifier 8 substantially constant. The amplifier 8 gain is primarily set by the gain of the rest of the positive feedback loop. For example by reducing the network 9 gain in half the gain of amplifier 8 is substantially doubled because the product of the gain around the oscillator loop is kept at or close to one.

When line 31 is at low level, amplifier network 90 is in the amplify mode. The signal flow is through input terminal 20, amplifier 8, to output terminal 21 with relay 35 connecting the amplifier 8 input to input terminal 20 and relay 36 connecting the amplifier 8 output to output terminal 21. The output signal of memory 39 remains constant at the last value of the signal level on line 34 during oscillate mode. The gain of amplifier 8 is maintained substantially constant by the stored output signal of memory 39 until the next time the amplifier 8 is readjusted during oscillate mode.

Figure 5:
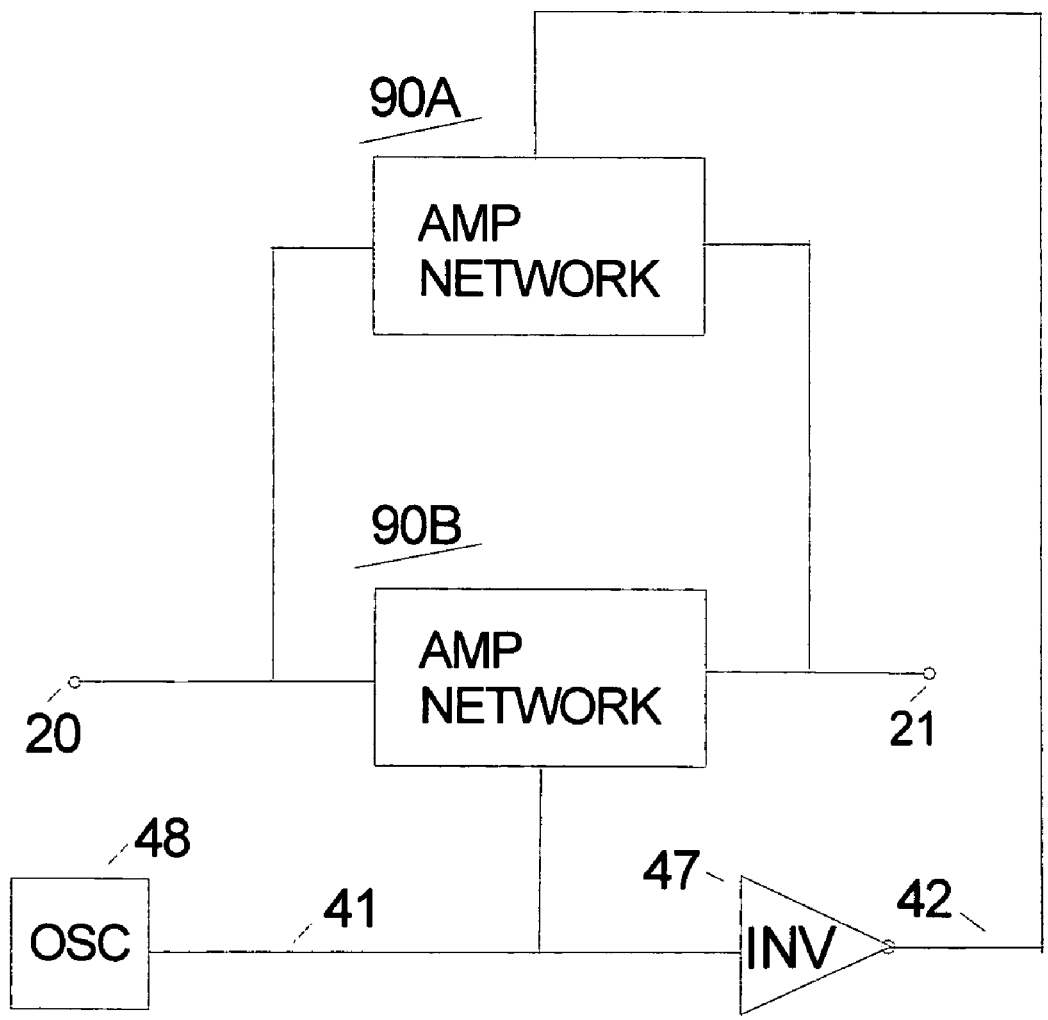
FIG. 5 shows a block diagram of constant gain amplifier system 5.

An other embodiment of the invention is shown in FIG. 5. The constant gain amplifier system 5 comprising amplifier network 90A, amplifier network 90B, controller 48, inverter 47, input terminal 20 and output terminal 21.

Controller 48 has an internal oscillator causing repeated cycling of output line 41 signal state between high and low levels. Line 41 is connected to the control input of amplifier network 90B and inverter 47. The inverter 47 output signal on line 42 is the opposite level of that on line 41. Line 42 is connected to the control input of amplifier network 90A.

When the signal level on line 41 is high, amplifier network 90B is in the oscillate mode and amplifier network 90A is in the amplify mode. When the signal level on line 41 is low, amplifier network 90B is in the amplify mode and amplifier network 90A is in the oscillate mode.

The signal flow is through input terminal 20 and which ever amplifier network 90A or 90B, is in the amplify mode to output terminal 21 while the other amplifier network, either 90A or 90B, which is in the oscillate mode has it's signal gain readjusted to the predetermined value. This allows continuous amplification of the signal applied to input terminal 20 and also the gain to be periodically readjusted to the correct value without interrupting signal flow through system 5.

Figure 6:
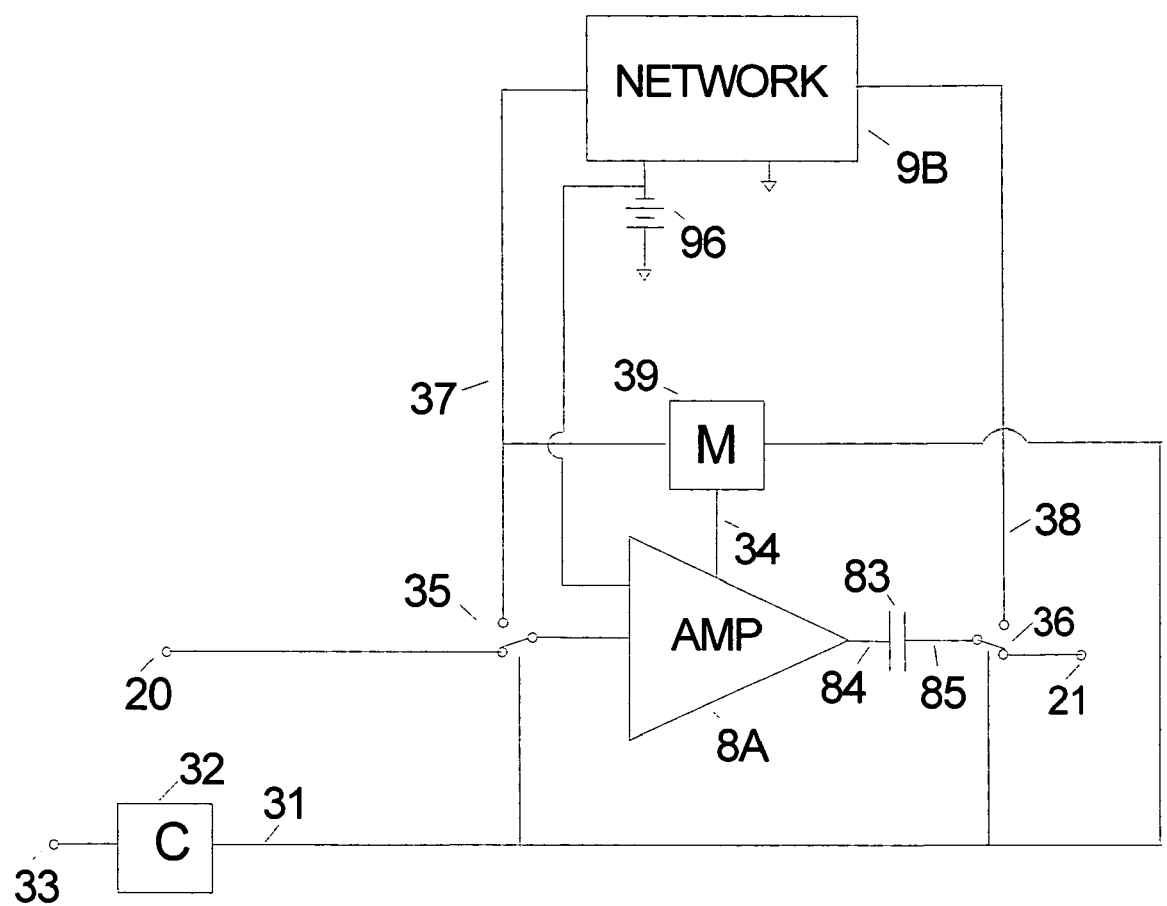
FIG. 6 shows a block diagram of constant gain and amplifier offset voltage auto zero system 6.

An other embodiment of the invention is constant gain and amplifier offset voltage auto zero system 6 shown in FIG. 6. This system 6 comprising controller 32, network 9B, memory 39, relay 35, relay 36, and amplifier 8A, capacitor 83, reference 96, input terminal 20, and output terminal 21.

The input signal at input terminal 33 controls the controller 32 output signal resulting in either a high or low level on line 31 or alternatively controller 32 may have an internal oscillator causing repeated cycling of output line 31 between high and low level independently of the input signal at input terminal 33. Line 31 is connected to relay 35, relay 36, and memory 39.

When the line 31 signal is at the high level, constant gain and amplifier offset voltage auto zero system 6 is in the oscillate and amplifier offset voltage auto zero mode. Amplifier 8A is a differential input amplifier. Network 9B, capacitor 83, and amplifier 8A, form a positive feedback loop which oscillates when relay 35 connects one amplifier 8A input to line 37 and relay 36 connects the amplifier 8A output through capacitor 83 to line 38. The other amplifier 8A input is connected to voltage reference 96. The output of network 9B on line 37 is also connected to the input of memory 39.

Network 9B has a low DC impedance level between line 37 and voltage reference 96, and also line 38 to ground. Voltage reference 96 may be set to any desired voltage level including zero volts (ground). Network 9B blocks DC voltage between lines 37 and 38 unless of course they are at the same voltage level.

With substantially zero DC voltage difference applied between the two inputs of amplifier 8A, the output of amplifier 8A on line 84 is substantially at a DC voltage level equal to it's gain times it's input offset voltage. The capacitor 83 is connected to line 84 and the other side through relay 36 and the input of network 9B to ground, it is understood that an other voltage level besides ground could also be used. This charges capacitor 83 to the DC voltage level difference between line 84 and ground. The oscillation AC voltage and the input offset voltage have substantially no effect on each other since the AC voltage level is of low amplitude and substantially sinusoidal.

When the line 31 signal is in the low state, constant gain and amplifier offset voltage auto zero system 6 is in the oscillate and amplifier offset voltage auto zero mode. The signal flow is into input terminal 20, through amplifier 8A, and capacitor 83 to output terminal 21 with relay 35 connecting the amplifier 8A input to input terminal 20 and relay 36 connecting capacitor 83 to output terminal 21. The DC voltage level on capacitor 83 is now added to the voltage level on line 84 resulting in cancellation of the DC input offset voltage at output terminal 21. Output terminal 21 needs to be connected to a high external load resistance to prevent a significant discharge of the voltage stored on capacitor 83.

The output signal level of memory 39 remains constant at the last value of the signal level on line 34 during oscillate and amplifier offset voltage auto zero mode. The gain of amplifier 8A is maintained at a substantially constant value by the stored output signal of memory 39 and it's DC input offset voltage remains substantially cancelled by the stored voltage on capacitor 83 until the next time constant gain and amplifier offset voltage auto zero system 6 is readjusted during oscillate and amplifier offset voltage auto zero mode.

Figure 7:
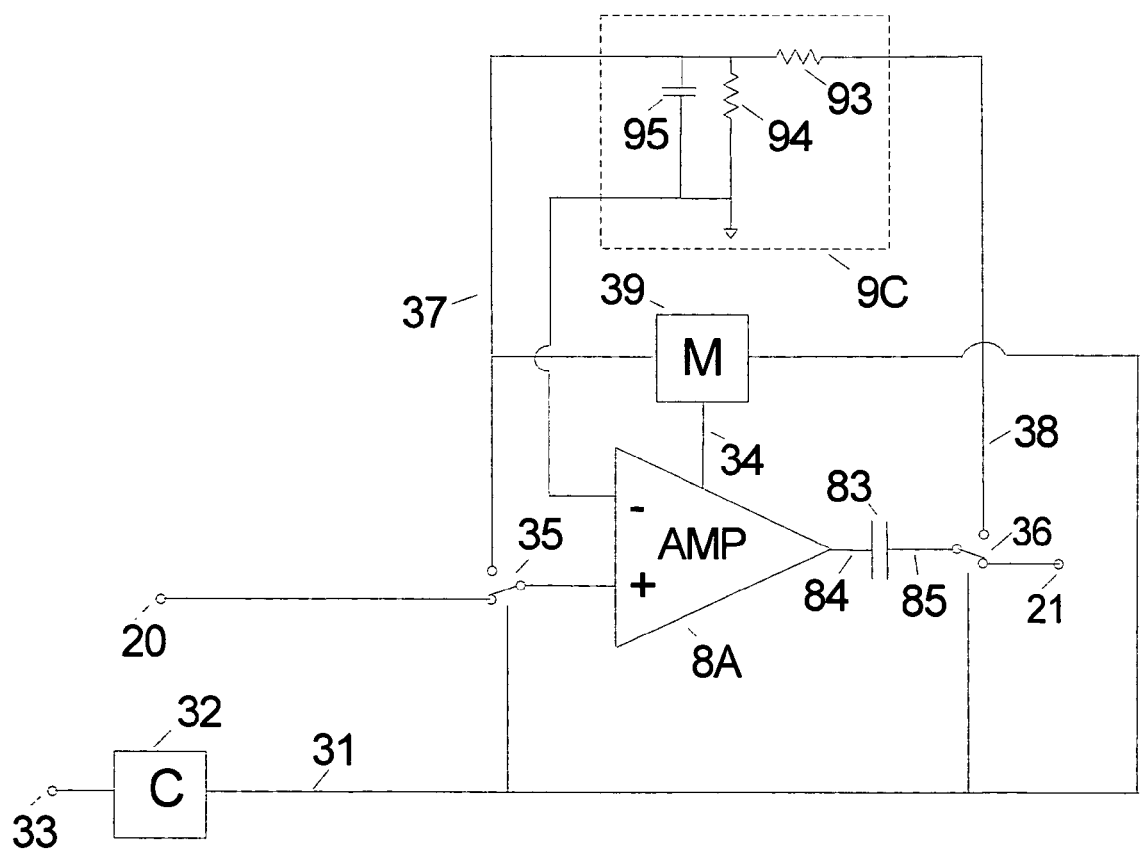
FIG. 7 shows a block diagram of constant gain and amplifier offset voltage auto zero system 6A.

An other version of the invention constant gain and amplifier offset voltage auto zero system 6 is shown in FIG. 7 as constant gain and amplifier offset voltage auto zero system 6A. This constant gain and amplifier offset voltage auto zero system 6A comprising controller 32, memory 39, relay 35, relay 36, amplifier 8A, capacitor 83, network 9C, input terminal 20 and output terminal 21. Network 9C consist of capacitor 95, resistor 93, and resistor 94.

When line 31 is at the high level, constant gain and amplifier offset voltage auto zero system 6A is in the oscillate and amplifier offset voltage auto zero mode. Network 9C, capacitor 83, and amplifier 8A, form a positive feedback loop which oscillates when relay 35 connects the amplifier 8A input to line 37 and relay 36 connects capacitor 83 to line 38.

The output of network 9C on line 37 is also connected to the input of memory 39. In network 9C resistor 93 connects to line 38 and it's other side to capacitor 95, resistor 94, and line 37. Capacitor 95 and resistor 94 both have their other side connected to ground.

The resistors of network 9C, resistor 94 and resistor 93, create a relatively low DC impedance level to ground having substantially zero DC voltage at network 9C output on line 37. The capacitor 83 in combination with the elements of network 9C form a phase shift network. This phase shift network when connected to the non-inverting input of amplifier 8A forms an oscillator.

When line 31 is at the level low, constant gain and amplifier offset voltage auto zero system 6A is in the amplify mode. The output signal level of memory 39 remains constant at the last value of the signal level on line 34 during oscillate mode. The gain of amplifier 8A is maintained at a substantially constant value by the stored output signal of memory 39 and it's DC input offset voltage remains substantially cancelled by the stored voltage on capacitor 83 until the next time constant gain and amplifier offset voltage auto zero system 6A is readjusted during the oscillate and amplifier offset voltage auto zero mode.

An other approach to obtaining a constant gain amplifier system is two use two substantially identical circuits which maybe either amplifiers or networks. One of the identical circuits is used in the input signal path while the other identical circuits is used as a section of the oscillator loop. Both identical circuits receive the same gain control signal. In the case of using amplifiers one of the amplifiers is used to amplify the input signal while the other amplifier is used as a section of the oscillator loop. The same gain control signal that is applied to the oscillator loop amplifier is also applied to the amplifier connected to the input signal.

Figure 8:
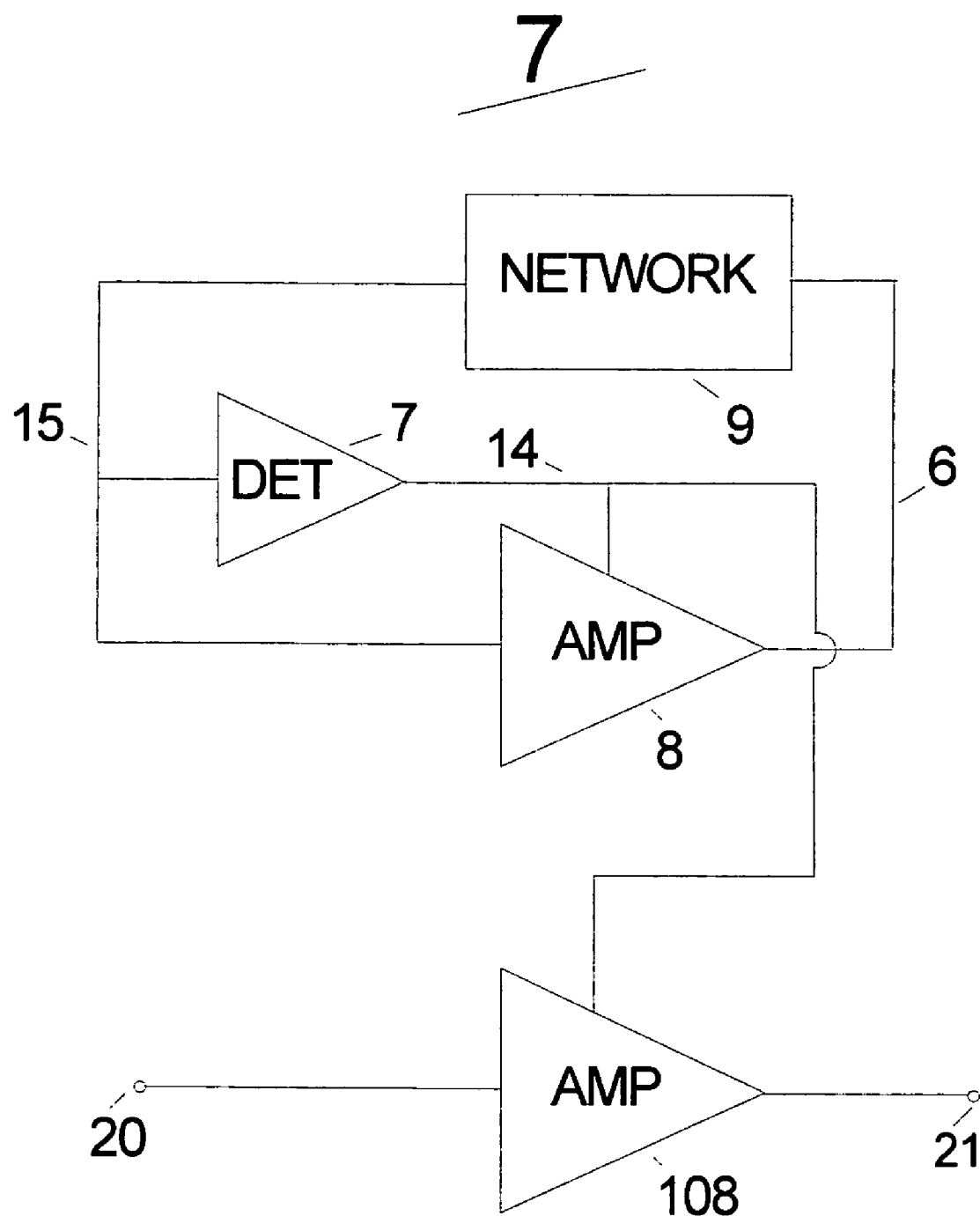
FIG. 8 shows a block diagram of constant gain amplifier in parallel with an identical amplifier receiving the same gain control signal.

An embodiment of this approach using amplifiers is shown in FIG. 8. The constant gain amplifier system 7 consist of the oscillator section and the amplifier section.

The oscillator section comprising network 9, detector 7, and amplifier 8. The output of network 9 on line 15 is connected to the input of amplifier 8 and detector 7. Amplifier 8 receives the signal to it's gain control input from the output of detector 7 on line 14. The output of amplifier 8 is on line 6 which is connected to the input and network 9. Network 9, amplifier 8, form a positive feedback loop which oscillates.

The amplifier section comprising amplifier 108, input terminal 20 and output terminal 21. The signal flow is through input terminal 20, then amplifier 108, to output terminal 21. Amplifier 108 receives the signal to it's gain control input from the output of detector 7 on line 14.

Amplifier 8 and 108 amplify the signals applied to their inputs by a gain value controlled by the signal level at their gain control input on line 14. The bandwidth of amplifier 8 and 108 are wide enough to provide uniform gain across the entire input signal frequency range and also the frequency of oscillation. The impedance connected to the Amplifier 8 and 108 outputs should remain constant and preferably at the same value. The output signal level of detector 7 is proportional to the oscillation AC signal level at it's input on line 15. Detector 7 also converts the signal at it's input to the type of output signal desired at the amplifier 8 and 108 gain control inputs.

The gain of amplifier 8 varies as the oscillator AC signal level of line 15 varies. As the oscillator AC signal level of line 15 increases, the gain of amplifier 8 decreases causing the oscillator loop gain to be reduced. When the oscillator loop gain is reduced below one, the oscillation stops, and the oscillator AC signal level on line 15 becomes zero. Thus the detector 7 output signal level is of a value that just maintains oscillation. In effect detector 7 provides negative feedback to just maintain a low oscillator AC signal level on line 15 which occurs at a oscillator loop gain at or close to one. Since the only oscillator loop gain that is not substantially constant is that of amplifier 8, the negative feedback through detector 7 maintains the gain of amplifier 8 at a substantially constant value. The value of amplifier 8 gain is primarily set by the gain of the rest of the positive feedback loop with the gain of the negative feedback loop through detector 7 having a lesser effect. Since amplifier 8 and 108 are substantially identical by maintaining amplifier 8 gain constant amplifier 108 gain is also kept constant.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A constant signal gain system that applies gain to an externally applied input signal to produce an output signal in which the level variation of said gain is reduced, comprising:
   an oscillator for generating an AC signal;
   said oscillator utilizing negative feedback of said AC signal to maintain loop gain of said oscillator at a substantially constant value;
   said negative feedback having a negative feedback signal with level responsive to level of said AC signal;
   at least one signal gain apparatus for applying gain to said AC signal and said externally applied input signal with said gain level responsive to level of said negative feedback signal;
   whereby level variation of said gain applied to said externally applied input signal is reduced by substantially maintaining said oscillator apparatus loop gain level at a constant value.

2. The invention of claim 1 wherein said AC signal and said externally applied input signal are each applied to separate said signal gain apparatus.

3. The invention of claim 1 wherein said AC signal gain apparatus and said external input signal gain apparatus comprise common elements for the adjustment of gain level applied to both said AC signal and said externally applied input signal.

4. The invention of claim 3 wherein:
   said common elements for the adjustment of said gain level alternately receive a signal responsive to one of the said AC signal and said externally applied input signal;
   the invention further comprises memory apparatus for storing a memory value that substantially maintained said oscillator loop gain level substantially at a constant value when said common elements received signal responsive to the said AC signal; and
   said memory apparatus having as an output signal said stored memory value to maintain said common elements gain level substantially at a constant value while receiving said externally applied input signal.

5. The invention of claim 1 wherein signal gain apparatus comprises an amplifier for providing said gain.

6. The invention of claim 5 in which said amplifier further comprises apparatus to reduce input offset voltage level of said amplifier.

7. The invention of claim 6 wherein said amplifier to reduce input offset voltage level of said amplifier uses auto zero.

8. A constant signal gain system that applies gain to an externally applied input signal to produce an output signal in which the level variation in said gain is reduced, comprising:
   a first amplification path for amplifying the externally applied input signal to produce the output signal, having a first signal input, a first signal output, and a first gain control input;
   a second amplification path having a second signal input, a second signal output, and a second gain control input and having the second signal output connected through a network to the second signal input, enabling oscillation and producing an oscillation signal;
   a detector for producing a negative feedback signal with a level proportional to the amplitude of said oscillation signal to maintain loop gain of said second amplification path at a substantially constant value; and
   wherein the negative feedback signal level is applied to both the first gain control input and the second gain control input whereby level variation in said gain applied to said externally applied input signal is reduced by substantially maintaining said second amplification path loop gain level substantially at a constant value.

9. The constant signal gain system recited in claim 8 wherein further the said first amplification path and the said second amplification path each comprise an amplifier circuit.

10. The invention of claim 9 further comprising amplifier circuit apparatus to reduce input offset voltage level of said amplifier circuit.

11. The invention of claim 10 wherein said apparatus to reduce input offset voltage level of said amplifier circuit uses auto zero.

12. The constant signal gain system recited in claim 8 wherein further:
    the first amplification path and the second amplification path are confluent through one of a single amplifier circuit and a single gain network;
    the system further comprises combiner apparatus for providing the sum of the said externally applied input signal and the said second signal output to the confluent first and second signal inputs; and
    the system further comprises a filter apparatus for blocking the said oscillation signal from the said output signal.

* * * * *